United States Patent
Tseng et al.

(10) Patent No.: US 8,674,355 B2
(45) Date of Patent: Mar. 18, 2014

(54) INTEGRATED CIRCUIT TEST UNITS WITH INTEGRATED PHYSICAL AND ELECTRICAL TEST REGIONS

(75) Inventors: Huan-Chi Tseng, Hsin-Chu (TW);
Heng-Hsin Liu, Yonghe (TW);
Shu-Cheng Kuo, Zhubei (TW);
Chien-Chang Lee, Hsin-Chu (TW);
Chun-Hung Lin, Taoyuan (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 364 days.

(21) Appl. No.: 12/980,865

(22) Filed: Dec. 29, 2010

(65) Prior Publication Data

US 2012/0168751 A1 Jul. 5, 2012

(51) Int. Cl.
*H01L 23/58* (2006.01)

(52) U.S. Cl.
USPC ..... 257/48; 257/797; 257/E21.522; 257/E21.524; 257/E21.529; 257/E21.53; 257/E21.531; 257/E23.179; 257/E21.521; 438/14; 438/17; 438/18; 324/762.01; 324/762.03; 324/762.05

(58) Field of Classification Search
USPC ............ 257/48, 797, E21.521, E21.522, 257/E21.524, E21.529, E21.53, E21.531, 257/E23.179; 438/13, 15, 17, 18, 401, 462; 324/762.01, 762.03, 762.05
See application file for complete search history.

(56) References Cited

U.S. PATENT DOCUMENTS

| | | | | |
|---|---|---|---|---|
| 6,146,994 | A * | 11/2000 | Hwang | 438/633 |
| 6,165,807 | A * | 12/2000 | Lee et al. | 438/18 |
| 6,348,808 | B1 * | 2/2002 | Yakura | 324/750.3 |
| 6,822,260 | B1 * | 11/2004 | Nariman et al. | 257/48 |
| 2004/0188678 | A1 * | 9/2004 | Wieczorek et al. | 257/48 |
| 2007/0292774 | A1 | 12/2007 | Ke et al. | |
| 2009/0206411 | A1 * | 8/2009 | Koketsu et al. | 257/368 |

* cited by examiner

*Primary Examiner* — Ermias Woldegeorgis
(74) *Attorney, Agent, or Firm* — Slater & Matsil, L.L.P.

(57) ABSTRACT

A device includes a test unit in a die. The test unit includes a physical test region including an active region, and a plurality of conductive lines over the active region and parallel to each other. The plurality of conductive lines has substantially a uniform spacing, wherein no contact plugs are directly over and connected to the plurality of conductive lines. The test unit further includes an electrical test region including a transistor having a gate formed of a same material, and at a same level, as the plurality of conductive lines; and contact plugs connected to a source, a drain, and the gate of the transistor. The test unit further includes an alignment mark adjacent the physical test region and the electrical test region.

18 Claims, 6 Drawing Sheets

INTEGRATED CIRCUIT TEST UNITS WITH INTEGRATED PHYSICAL AND ELECTRICAL TEST REGIONS

BACKGROUND

In the manufacturing of integrated circuits, wafer acceptance tests need to be performed to ensure that the manufactured wafers meet the design specification. Conventionally, test units may be formed in scribe lines and used in the wafer acceptance tests. However, the test units in the scribe lines may not always accurately reflect the performance of intra-die integrated circuits that are formed inside dies. For example, due to the non-uniformity in the wafers, the critical dimensions of polysilicon lines in different portions of a die may be different from each other, and may be from the critical dimensions of polysilicon lines in scribe lines. Accordingly, when the test units are limited in the scribe lines of wafers, the overall uniformity of dies cannot be obtained accurately.

Intra-die test units, which were also known as dose mappers (DOMAs), were thus formed as intra-die test units, so that the intra-die uniformity of the integrated circuits can be measured. However, conventional DOMAs suffer from various limitations.

BRIEF DESCRIPTION OF THE DRAWINGS

For a more complete understanding of the embodiments, and the advantages thereof, reference is now made to the following descriptions taken in conjunction with the accompanying drawings, in which.

DETAILED DESCRIPTION OF ILLUSTRATIVE EMBODIMENTS

The making and using of the embodiments of the disclosure are discussed in detail below. It should be appreciated, however, that the embodiments provide many applicable inventive concepts that can be embodied in a wide variety of specific contexts. The specific embodiments discussed are merely illustrative, and do not limit the scope of the disclosure.

A novel intra-die integrated circuit test unit is provided in accordance with an embodiment. The variations and the operation of the embodiment are then discussed. Throughout the various views and illustrative embodiments, like reference numbers are used to designate like elements.

Figure 1A:
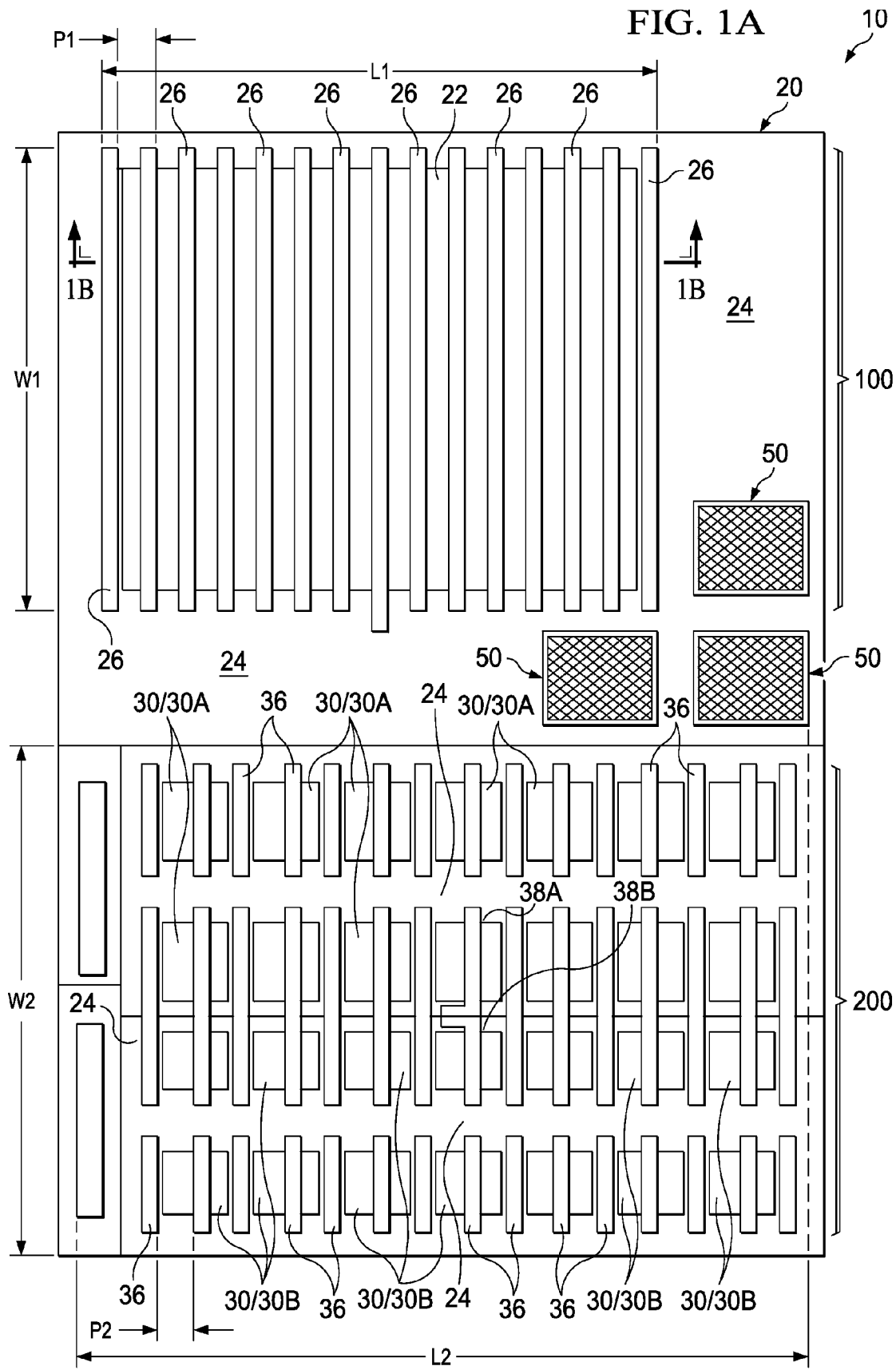
FIG. 1A illustrates a layout of an integrated circuit test unit in a test wafer/die, wherein the test wafer/die includes a physical test region and an electrical test region therein.

FIG. 1A illustrates a layout of integrated circuit test unit 20, which is also referred to as a dose mapper (DOMA) throughout the description. It is noted that FIG. 1A does not illustrate contact plugs and contact pads, although they may also be formed in DOMA 20. DOMA 20 is also a portion of die or wafer (referred to as a wafer/die hereinafter) 10. DOMA 20 includes physical test region 100 and electrical test region 200. Physical test region 100 is configured to be used for the measurement of the physical parameters of the integrated circuits. In an embodiment, physical test region 100 is used to measure the critical-dimension uniformity (CDU) of gate electrodes, also known as poly lines when the gate electrodes are formed of polysilicon. DOMA 20 may occupy a rectangular chip area having a width and/or a length smaller than about 10 μm, or smaller than about 5 μm. Each of physical test region 100 and electrical test region 200 may also occupy a rectangular chip area.

Figure 1B:
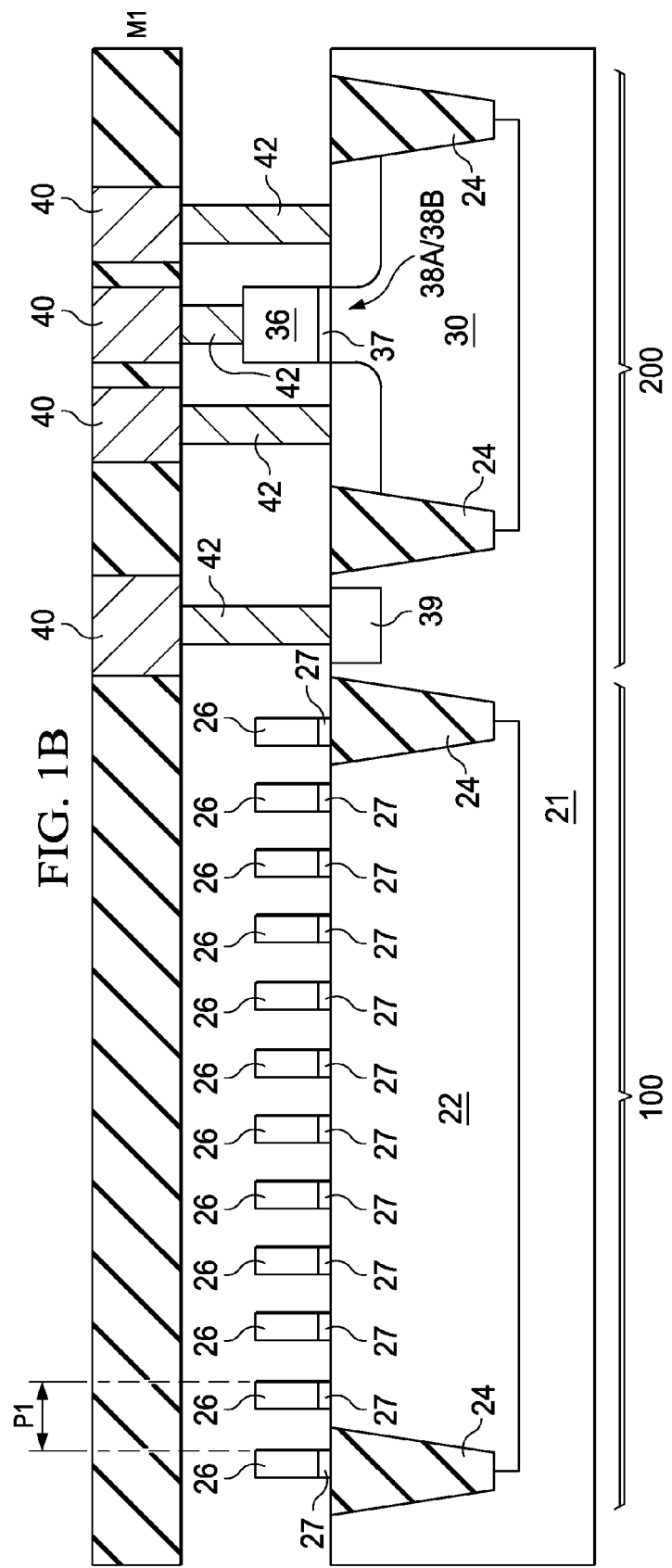
FIG. 1B illustrates a schematic cross-sectional view of portions of the test unit shown in FIG. 1A.

FIG. 1B illustrates a cross-sectional view of a portion of FIG. 1A, wherein the cross-sectional view of a portion of physical test region 100 is obtained from the plane crossing line 1B-1B in FIG. 1A. It is noted that although the portions of electrical test region 200 are illustrated as being in the same plane as in physical test region 100, they are actually extracted from several different planes. Referring to FIG. 1B, in physical test region 100, bulk active region 22 (a doped substrate well region) is formed in the respective semiconductor substrate 21. Active region 22 may be encircled by shallow trench isolation (STI) region(s) 24. A plurality of parallel conductive lines 26 are formed over active region 22. Dielectric layers 27 may be formed to separate conductive lines 26 from active region 22. The plurality of conductive lines 26 may have a uniform spacing from each other, wherein the corresponding uniform pitch is shown as P1. In an embodiment, pitch P1 is the smallest pitch allowed by the respective forming technology. For example, in 40 nm technology, pitch P1 may be about 180 nm. The total count of the parallel conductive lines 26 may be greater than about 6, and may be greater than about 10, for example. In an exemplary embodiment, physical test region 100 has length L1 (FIG. 1A) between about 2.5 μm and about 3 μm, and width W1 between about 2.3 μm and about 3 μm. It is realized, however, that the dimensions recited throughout the description are merely examples, and may be changed if different forming technologies are used.

Figure 6:
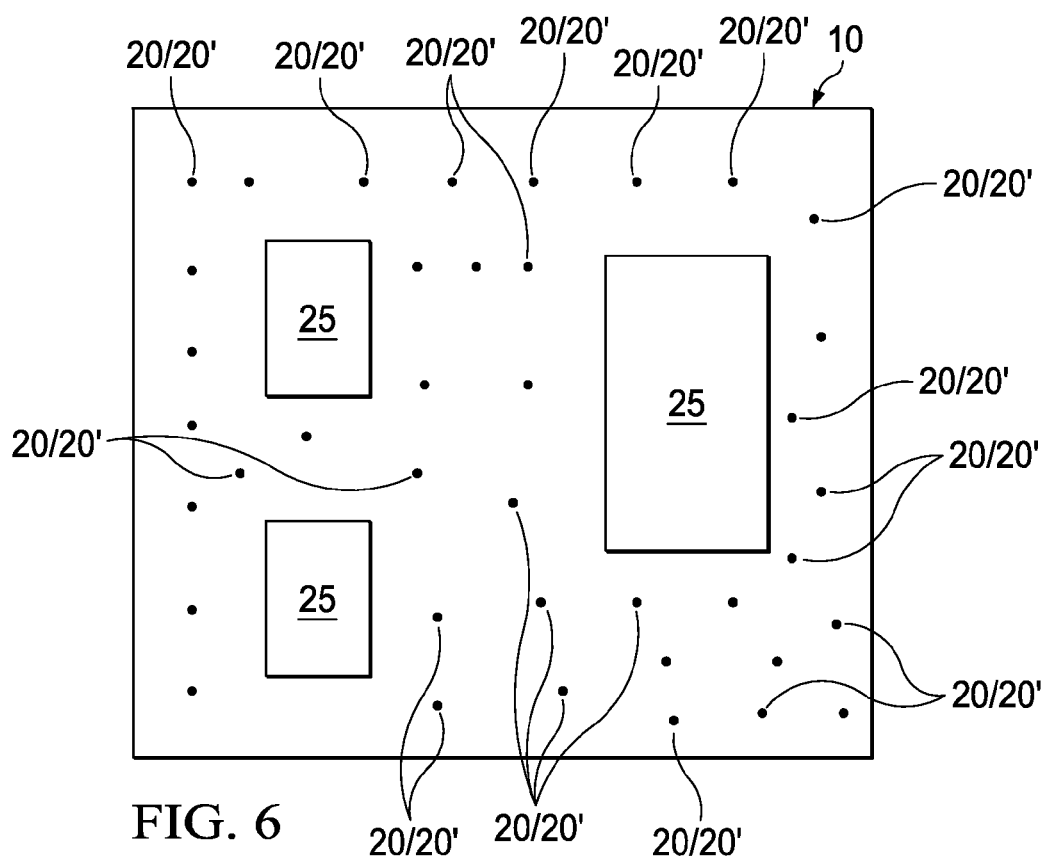
FIG. 6 illustrates a top view of a die, and test units distributed throughout the die.

Physical test region 100 may be used to measure, for example, the CDU across the respective wafer/die 10. Accordingly, there may be no contact plugs and no contact pads that are directly over and connected to conductive lines 26. In an embodiment, as shown in FIG. 6, a plurality of DOMAs 20 is formed in a plurality of locations that are distributed throughout wafer/die 10. The widths (CDs) of conductive lines 26 in different locations of wafer/die 10 may thus be measured, and the CDU of wafer/die 10 may be found.

Referring back to FIG. 1A, electrical test region 200 includes a plurality of active regions 30 (doped well regions in substrate 21, please refer to FIG. 1B) separate from each other by STI regions 24. Active regions 30 may also include p-type active regions (p-wells) 30A and n-type active regions (n-wells) 30B.

A plurality of conductive lines 36 are formed over active regions 30, and forming transistors together with the underlying active regions 30. Conductive lines 36 includes first portions that are directly over active regions 30, and second portions directly over STI regions 24, which second portions are dummy gate electrodes. In an embodiment, conductive lines 36 have a uniform pitch P2, which may be greater than pitch P1, although it may also be equal to pitch P1. The transistors in electrical test region 200 include nMOS transistors 38A and pMOS transistors 38B, which are formed over p-type active regions 30A and n-type active regions 30B, respectively. Conductive lines 26 and 36 are formed of the same conductive material, and are formed simultaneously in same process steps. Dielectric layers 27 and 37 are also formed of the same dielectric material, and are formed simultaneously.

Figure 2:
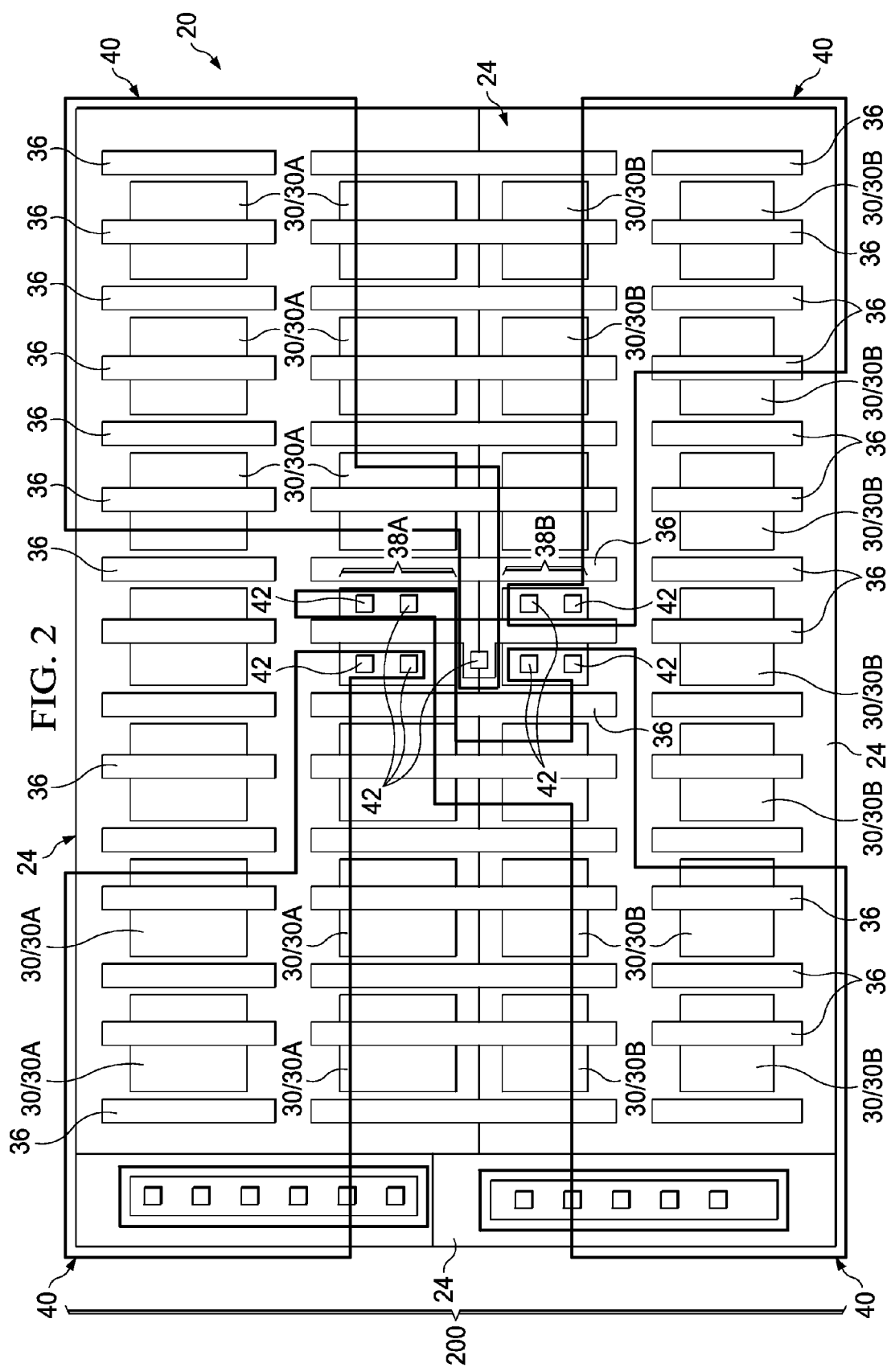
FIG. 2 illustrates the layout of the physical test region.

Electrical test region 200 may be used to measure the electrical performance of integrate circuits, for example, the saturation current (Id) uniformity (IDU) of transistors across the respective wafer/die 10. FIG. 2 illustrates a magnified view of the layout of electrical test region 200, with contact pads 40 and the respective contact plugs 42 also being illustrated. There may be four contact pads 40, with two electrically connected to, and disposed directly over, the sources of transistors 38A and 38B, one electrically connected and directly over the common drain of transistors 38A and 38B, and one electrically connected and directly over the gates of transistors 38A and 38B. The contact plug 42 is connected to substrate 21 (please refer to FIG. 1B), for example, through a heavily doped region 39. Contact pads 40 are formed in the bottom metal layer (M1, refer to FIG. 1B). As shown in FIG. 2, contact pads 40 may extend to the boundaries of the rectangular electrical test region 200.

Figure 3:
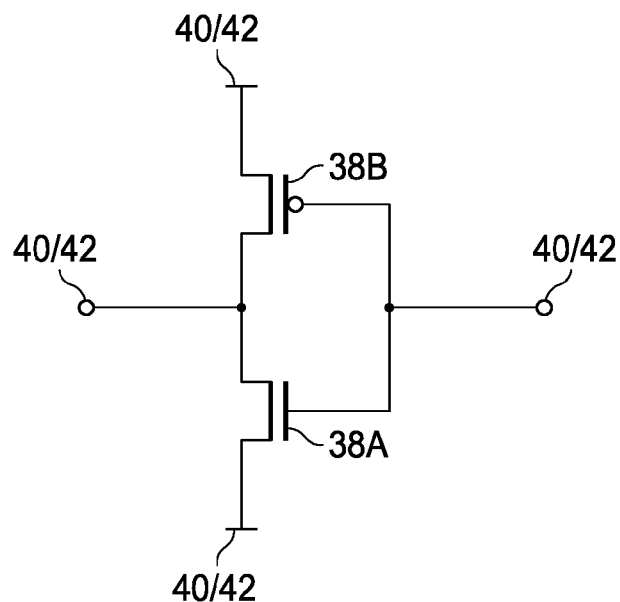
FIG. 3 illustrates a circuit diagram of a pMOS transistor and an nMOS transistor in the electrical test region, and contact pads and contact plugs used for measuring electrical properties of the pMOS transistor and the nMOS transistor.

FIG. 3 illustrates an exemplary circuit diagram of transistors 38A and 38B. Through four contact pads 40 and the respective contact plugs 42, the electrical properties such as the saturation currents of each of transistors 38A and 38B may be measured. In an embodiment, as shown in FIG. 6, a plurality of DOMAs 20 is formed in a plurality of locations that are distributed through of wafer/die 10. The saturation currents of the transistors in each of the plurality of DOMAs 20 may be measured, and the IDU of wafer/die 10 may be determined.

Figure 4:
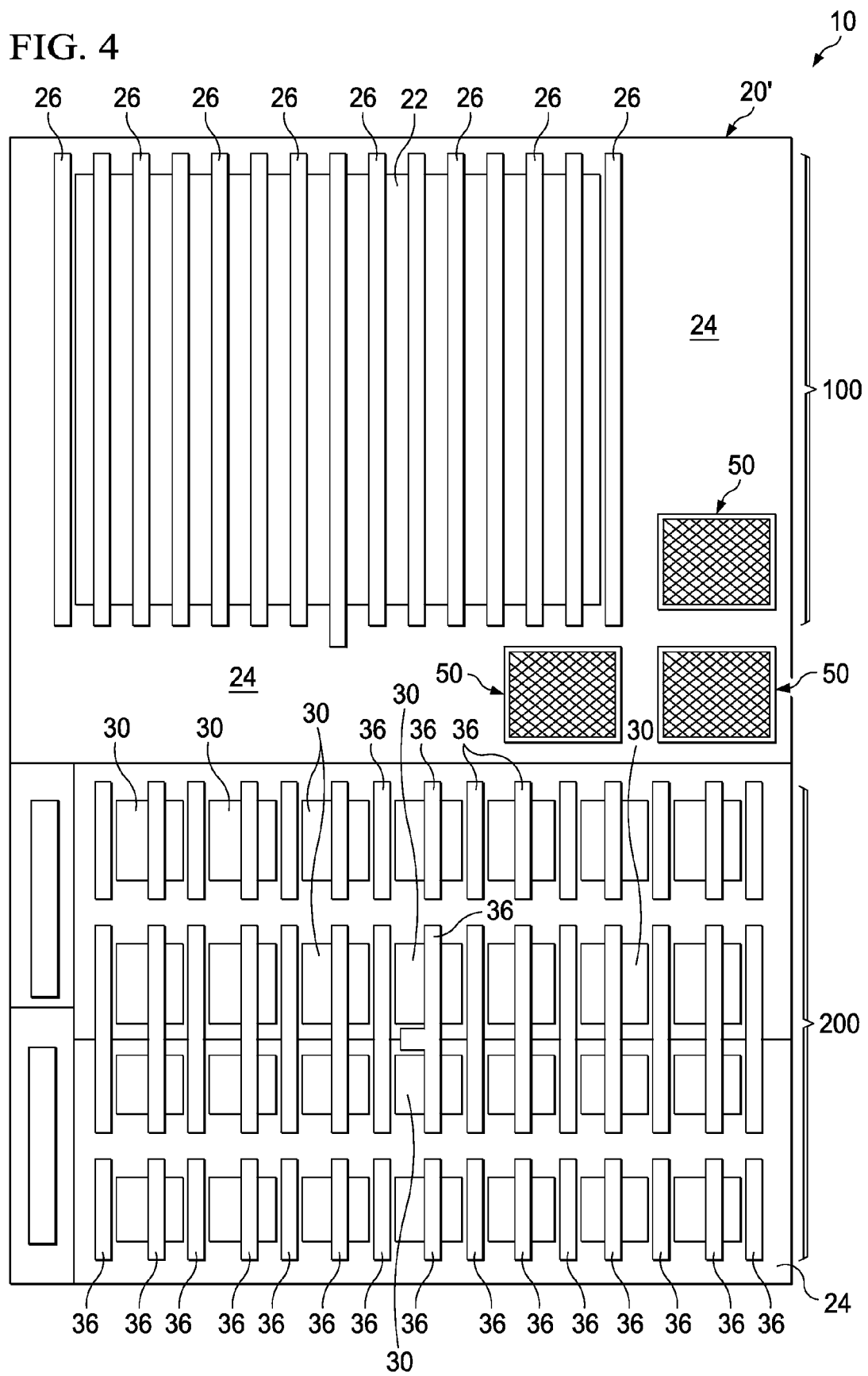
FIG. 4 illustrates a layout of an integrated circuit test unit in a mass-production wafer/die, wherein the test unit includes a physical test region and an electrical test region therein.

The DOMAs 20 as shown in FIGS. 1A, 1B, and 2 are formed in test wafers, and the electrical and physical performance (such as CDU and IDU) can be measured from the test wafers. FIG. 4 illustrates a top view of an exemplary DOMA 20', which is formed in the mass-production wafers. The mass-production wafers also include some of the features of DOMAs 20 including the active regions 22 and 30 and conductive lines 26 and 36. However, contact plugs 42 and contact pads 40 are not formed in the mass-production wafers. The same photo lithography masks (not shown) may be used to form active regions 22 and 30 and conductive lines 28 and 36 for both mass-production wafers and test wafers. Accordingly, the numbers and the locations of the DOMAs 20' in the mass-production wafers may be identical to the DOMAs 20 in the test wafers. Also, active regions 22 and 30 and conductive lines 26 and 36 in DOMAs 20' of the mass-production wafers may be identical to the respective active regions 22 and 30 and conductive lines 26 and 36 of the respective DOMAs 20 in the test wafers.

Referring back to FIG. 1A, DOMA 20 includes alignment mark 50, which includes one or more pattern that may be used to identify DOMA 20. Alignment mark 50 is adjacent to physical test region 100 and electrical test region 200, with the distance between alignment marks 50 and regions 100/200 being smaller than about 0.2 μm, for example. In an embodiment, alignment mark 50 is formed using the same material, and in the same process steps, as for forming conductive lines 26 and 36. Since physical test region 100 and electrical test region 200 are formed in the same DOMA 20 and associated with the same alignment mark 50, by finding one alignment mark 50, both physical and electrical properties can be measured.

Figure 5:
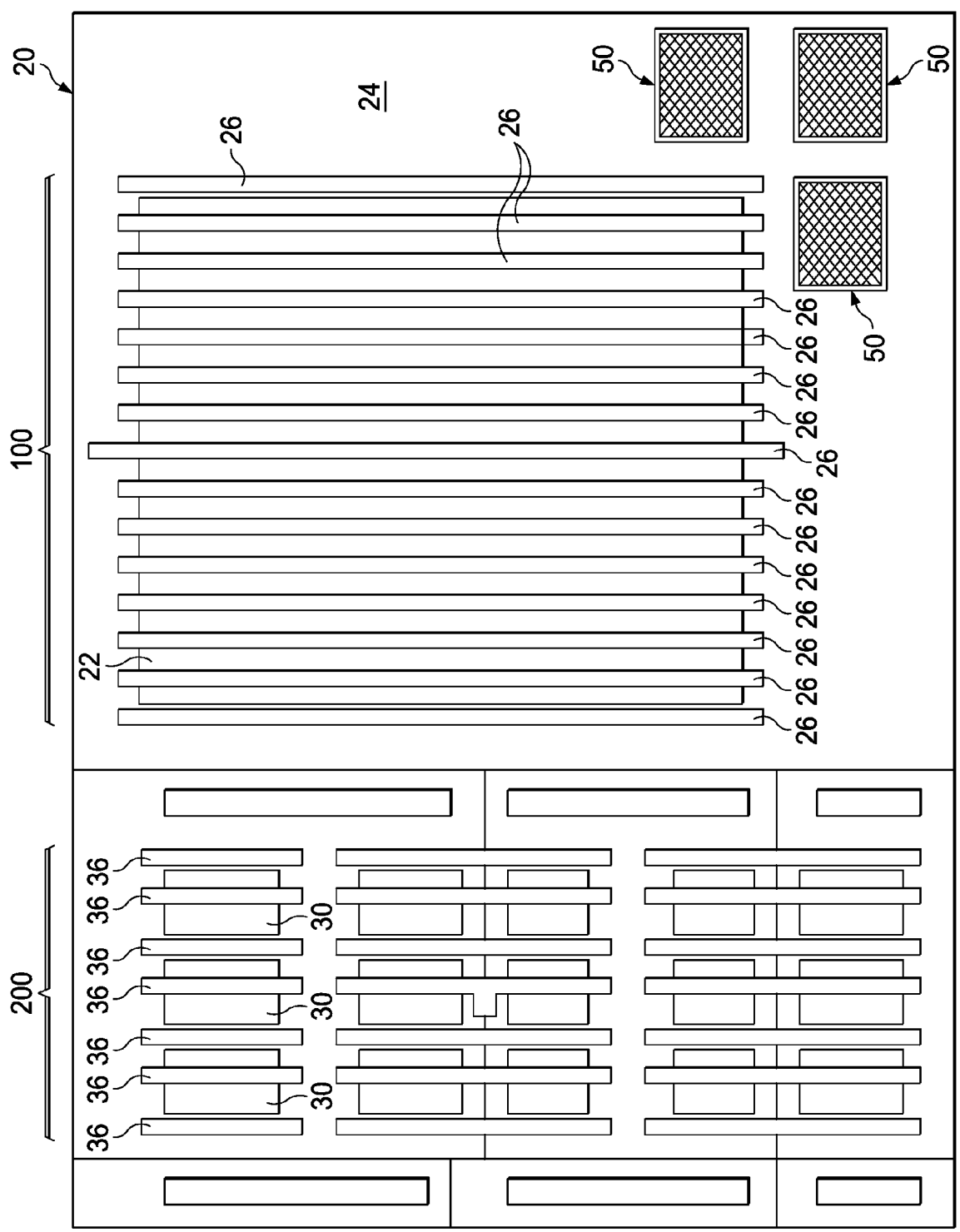
FIG. 5 illustrates a test unit having a different layout as the test unit shown in FIG. 1A.

It is realized that DOMAs 20 can have various shapes, such as rectangles, and different dimensions in order to suit different chip areas that are available for inserting the DOMAs. Also, each of physical test region 100 and electrical test region 200 may have various different layouts. FIG. 5 illustrates an alternative layout of DOMA 20. By re-arranging the physical and electrical test devices, such as the active regions 22/30 and conductive lines 26/36, and the like, as having different dimensions and/or in different orientations, DOMAs 20 can have different sizes. In an exemplary embodiment, the DOMA 20 as shown in FIG. 1 may have a size as small as about 6.3 μm×3.6 μm, while the DOMA 20 as shown in FIG. 5 may have a size as small as about 3.6 μm×5.7 μm. Therefore, depending on the shape and the size of the chip areas available for inserting the DOMAs, DOMAs 20 that have suitable shapes and sizes may be selected and inserted.

FIG. 6 illustrates a schematic top view of exemplary wafer/die 10, wherein each of the dots represents one of DOMAs 20 and 20'. DOMAs 20/20' may be distributed throughout wafer/die 10. In an embodiment, wafer/die 10 is a test wafer/die, and the dots marked as 20/20' are the DOMAs 20 as shown in FIG. 1A. When wafer/die 10 is a mass-production wafer/die, the dots marked as 20/20' are the DOMAs 20' as shown in FIG. 5. FIG. 6 also illustrates a plurality of intellectual properties (IPs), which are standard cells. DOMAs 20/20' are inserted to the chip areas outside of IPs 25, and not into IPs 25.

In the embodiments, by forming physical test region 100 and electrical test region 200 in the same DOMA 20, both electrical properties and physical properties can be obtained from the same DOMA, wherein only one alignment mark identification step is needed. This increases the throughput in the testing process. Furthermore, by adjusting the settings of the measurement tools that are used for measuring the electrical properties and physical properties, the sizes of the DOMAs may be reduced significantly compared to conventional DOMAs. This allows for more DOMAs to be inserted in a die, and hence the determination of the IDU and CDU is more accurate.

In accordance with embodiments, a device includes a test unit in a die. The test unit includes a physical test region including an active region, and a plurality of conductive lines over the active region and parallel to each other. The plurality of conductive lines has substantially a uniform spacing, wherein no contact plugs are directly over and connected to the plurality of conductive lines. The test unit further includes an electrical test region including a transistor having a gate formed of a same material, and at a same level, as the plurality of conductive lines; and contact plugs connected to a source, a drain, and the gate of the transistor. The test unit further includes an alignment mark adjacent the physical test region and the electrical test region.

In accordance with other embodiments, a device includes a plurality of test units in a die and identical to each other. Each of the plurality of test units includes a physical test region including a bulk active region; and a first plurality of conductive lines directly over the bulk active region and parallel to each other. The first plurality of conductive lines has a first uniform pitch. Each of the plurality of test units further includes an electrical test region adjacent to the physical test region and including a plurality of active regions separate from each other by STI regions; and a second plurality of conductive lines. Each of the plurality of active regions forms a transistor with one of the second plurality of conductive lines. Each of the plurality of test units further includes an alignment mark formed of a same material as the first and the second plurality of conductive lines.

In accordance with yet other embodiments, a device includes a test unit in a die and including a physical test region having a rectangular active region, and a first plurality of conductive lines directly over the rectangular active region and parallel to each other. No contact plugs are directly over, and electrically coupled to, the first plurality of conductive lines. The test unit further includes an electrical test region occupying a rectangular chip area of the die. The electrical test region is adjacent to the physical test region and includes a plurality of active regions separate from each other by STI regions; a second plurality of conductive lines, wherein each of the plurality of active regions forms a transistor with one of the second plurality of conductive lines; and contact plugs directly over and electrically coupled to a source, a drain, and a gate of each of a pMOS transistor and an nMOS transistor. The pMOS transistor and the nMOS transistor are in the electrical test region. No contact plugs are directly over and electrically coupled to gates, sources, and drains of remaining transistors in the electrical test region. The test unit includes an alignment mark adjacent to the physical test region and the electrical test region.

Although the embodiments and their advantages have been described in detail, it should be understood that various changes, substitutions and alterations can be made herein without departing from the spirit and scope of the embodiments as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:

1. A device comprising:
    a test unit in a die and comprising:
        a physical test region comprising an active region, and a plurality of conductive lines over the active region and parallel to each other, wherein each of the plurality of conductive lines has a strip top-view shape with a length and a width smaller than the length, wherein the plurality of conductive lines has substantially an uniform spacing, and wherein no contact plugs are directly over and connected to the plurality of conductive lines;
        an electrical test region comprising:
            a transistor comprising a gate formed of a same material, and at a same level, as the plurality of conductive lines;
            contact plugs over and connected to a source, a drain, and the gate of the transistor; and
            a plurality of active regions and a plurality of gate electrodes, wherein each of the active regions forms a transistor with one of the plurality of gate electrodes, wherein the plurality of gate electrodes is parallel to each other, and wherein the plurality of gate electrodes has a substantially uniform pitch greater than a pitch of the plurality of conductive lines in the physical test region; and
        an alignment mark adjacent the physical test region and the electrical test region.

2. The device of claim 1, wherein the die comprises a plurality of test units spaced apart from each other and from the test unit, wherein each of the plurality of test units is identical to the test unit.

3. The device of claim 2, wherein the plurality of test units is distributed throughout the die.

4. The device of claim 1, wherein a pitch of the plurality of conductive lines is substantially equal to a minimum spacing allowed by a forming technology for forming the device.

5. The device of claim 1 further comprising four metal pads electrically coupled to the gate, a source, and a drain of the transistor and a substrate of the die, wherein the four metal pads are substantially limited within a chip area of the electrical test region, and extend substantially to boundaries of the electrical test region.

6. The device of claim 5, wherein the transistor is a pMOS transistor, and wherein the electrical test region further comprises an nMOS transistor, and wherein the four metal pads are further coupled to a gate, a source, and a drain of the nMOS transistor.

7. The device of claim 1, wherein the electrical test region further comprises a plurality of additional transistors, and wherein the device does not comprise contact plugs connected to the plurality of additional transistors.

8. A device comprising:
    a plurality of test units in a die and identical to each other, wherein each of the plurality of test units comprises:
        a physical test region comprising:
            a bulk active region; and
            a first plurality of conductive lines directly over the bulk active region and parallel to each other, wherein the first plurality of conductive lines has a first uniform pitch;
        an electrical test region adjacent to the physical test region and comprising:
            a plurality of active regions separate from each other by shallow trench isolation (STI) regions; and
            a second plurality of conductive lines, wherein each of the plurality of active regions forms a transistor with one of the second plurality of conductive lines; and
        an alignment mark formed of a same material as the first and the second plurality of conductive lines.

9. The device of claim 8, wherein each of the physical test region and the electrical test region occupies a rectangular chip area.

10. The device of claim 8, wherein each of the plurality of test units occupies a chip area smaller than about 10 µm×10 µm.

11. The device of claim 8, wherein there are no contact plugs and metal pads directly over and electrically coupled to the first and the second plurality of conductive lines.

12. The device of claim 8 further comprising four metal pads over and connected to a source, a drain, and a gate of each of a pMOS transistor and an nMOS transistor and to a substrate of the die, wherein the pMOS transistor and the nMOS transistor are in the electrical test region.

13. The device of claim 12, wherein the electrical test region occupies a rectangular chip area, and wherein the four metal pads substantially extend to four boundaries of the rectangular chip area.

14. The device of claim 12, wherein there is no contact plugs and metal pads directly over and electrically coupled to the first plurality of conductive lines.

15. The device of claim 8, wherein the second plurality of conductive lines has a second uniform pitch smaller than the first uniform pitch.

16. The device of claim 8, wherein the second plurality of conductive lines comprises first portions directly over the plurality of active regions, and second portions directly over the STI regions, and wherein the second portions are separated from each other by the first portions.

17. A device comprising:

a test unit in a die and comprising:

a physical test region comprising a rectangular active region, and a first plurality of conductive lines directly over the rectangular active region and parallel to each other, wherein no contact plugs are directly over, and electrically coupled to, the first plurality of conductive lines;

an electrical test region occupying a rectangular chip area of the die, wherein the electrical test region is adjacent to the physical test region and comprising:

a plurality of active regions separate from each other by shallow trench isolation (STI) regions;

a second plurality of conductive lines, wherein each of the plurality of active regions forms a transistor with one of the second plurality of conductive lines; and contact plugs directly over and electrically coupled to a source, a drain, and a gate of each of a pMOS transistor and an nMOS transistor, wherein the pMOS transistor and the nMOS transistor are in the electrical test region, and wherein no contact plugs are directly over and electrically coupled to gates, sources, and drains of remaining transistors in the electrical test region; and an alignment mark adjacent to the physical test region and the electrical test region.

18. The device of claim 17 further comprising a plurality of metal pads directly over and electrically connected to the contact plugs, wherein the plurality of metal pads substantially extends to edges of the electrical test region.

* * * * *